United States Patent
Kim et al.

[11] Patent Number: 6,076,173
[45] Date of Patent: Jun. 13, 2000

[54] ARCHITECTURAL COVERAGE MEASURE

[75] Inventors: Kee Sup Kim; Rathish Jayabharathi, both of Folsom; Saviz Artang, Davis, all of Calif.

[73] Assignee: Intel Corporation, Santa Clara, Calif.

[21] Appl. No.: 09/001,607

[22] Filed: Dec. 31, 1997

[51] Int. Cl.$^7$ .................................................. G06F 11/00
[52] U.S. Cl. ............................... 714/25; 714/40; 714/742
[58] Field of Search ................................ 714/41, 40, 742, 714/703, 25

[56] References Cited

U.S. PATENT DOCUMENTS

| | | | |
|---|---|---|---|
| 5,539,680 | 7/1996 | Palnitkar et al. | 364/578 |
| 5,631,857 | 5/1997 | Kobrosly et al. | 364/581 |
| 5,724,504 | 3/1998 | Aharon et al. | 395/183.09 |
| 5,740,353 | 4/1998 | Kreulen et al. | 395/183.18 |

OTHER PUBLICATIONS

Rational Software Corporation, PureCoverage User's Guide, web, pp. 1–1 to 1–3, 1997.

Abadir, Magdy S., Tiger: Testability Insertion Guidance Expert System, IEEE, pp. 562–565, 1989.

*Primary Examiner*—Joseph E. Palys
*Assistant Examiner*—Rita Ziemer
*Attorney, Agent, or Firm*—Trop, Pruner, Hu & Miles, P.C.

[57] ABSTRACT

A tractable architecture level coverage measure uses information about the coverage measures obtained by the data path blocks, control logic blocks and cache to obtain an overall measure of coverage. This technique is applicable to a variety of different designs using different fabrication processes. Moreover, it allows the use of extended length test vectors, for example, such as those using commercial software applications. Since the coverage measure does not rely on the traditional stuck at model, it is applicable to extended length test vectors that may be used with high performance systems.

25 Claims, 2 Drawing Sheets

ARCHITECTURAL COVERAGE MEASURE

This invention relates generally to test grading of tests used to detect faults or defects in complex systems such as microprocessors and the like.

BACKGROUND OF THE INVENTION

There are a variety of techniques for determining whether a manufactured part or design has faults or defects. In order to determine the effectiveness of such tests, it is necessary to have a measure of the test's efficacy in locating faults or defects. Such test evaluation techniques, called test or fault grading, give a coverage measure which indicates how good the tests are in locating defects or faults.

Faults model fabrication defects. A designer can then determine if a set or program of test patterns, called test vectors, can detect an acceptable percentage of faults.

Most fault coverage systems rely on the stuck at fault model which assumes that each tested node is stuck at zero or stuck at one. With this assumption, a test is run to see if a given task or test vector can detect a particular stuck at fault. Common stuck at faults could include tying nodes high or low for the entire test, a metallization that is stuck open or shorted, faults that occur between adjacent runs, shorted pins, or shorts to ground or power supply.

Fault coverage is the extent to which a given set of test vectors can detect faults. If a given set of test vectors can detect 50% of all simulated stuck at one or zero faults in a given system, it has a coverage of 50%. Generally, the fault coverage depends on the testability of the logic design to some degree and also the comprehensiveness of the test vectors.

Commercial testers may use machine language test programs. In testing microprocessors, these tests might be run for a matter of seconds because the testers are expensive. As a result, a relatively short program of test vectors is necessary and it may then be unclear whether good coverage was always achieved. Such a methodology puts a high premium on locating the best set of test vectors to give the best coverage. One attempts to improve the coverage by making intelligent assumptions about the defect behavior for a given product.

Thus, in one conventional methodology used in microprocessors and other complex systems, a test is run on a commercial tester to determine the presence of defects over a few seconds of code in order to make the test economical. The effectiveness of these short duration tests can be evaluated using the stuck at fault model. As systems become more complex, the efficacy of these short tests, using the structural tester, has come to be questioned.

As a result, system tests have been used in place of expensive structural testers. In the system test, commercial operating system or application machine language software may be run for a more extended period of time on the order of a minute or more. In effect then, a rather large system test vector set is utilized.

Because of the complexity of this test it is not possible to use the traditional stuck at fault model to determine the test quality. This is because the stuck at fault model is basically a gate level model. It would be difficult to determine over an extended period of time with a program running at relatively high speed (such as 200 megahertz or greater) whether or not the coverage was acceptable.

For example, to simulate one second of program, it would take approximately 20,000 days of CPU time (on a leading edge server) to fault simulate 2,000 fault samples for a 6 million transistor CPU design.

The basic methodology of using the system level test is to start with a relatively large program of extended time and to trim out the parts of the program that do not detect defects in a given system. After these parts are trimmed away, the remaining time is then assumed to be effectively used in locating defects. Of course, one problem is that if the underlying model changes (which may occur when there is an essential process change or perhaps even a change in fabrication facility), it is no longer clear whether the system test can be relied upon.

Thus, there is a continuing need for simulation-efficient coverage measures useful for testing complex systems such as microprocessors.

SUMMARY OF THE INVENTION

Aspects of the present invention may provide a tractable architecture level coverage measure for complex systems such as microprocessors. This measure may, in some embodiments, be applicable to a variety of different designs and to the economical use of extended length program simulation traces. It may also be adaptable to changing process fabrication techniques.

In accordance with one aspect of the present invention, a method is provided for determining a coverage measure for selecting defect screening tests for a system having a control, data path and cache. The method includes the step of obtaining a coverage measure for one or more of the cache, control logic and data paths. The coverage measures obtained may then be used as a measure of system level coverage.

DETAILED DESCRIPTION

Figure 1:
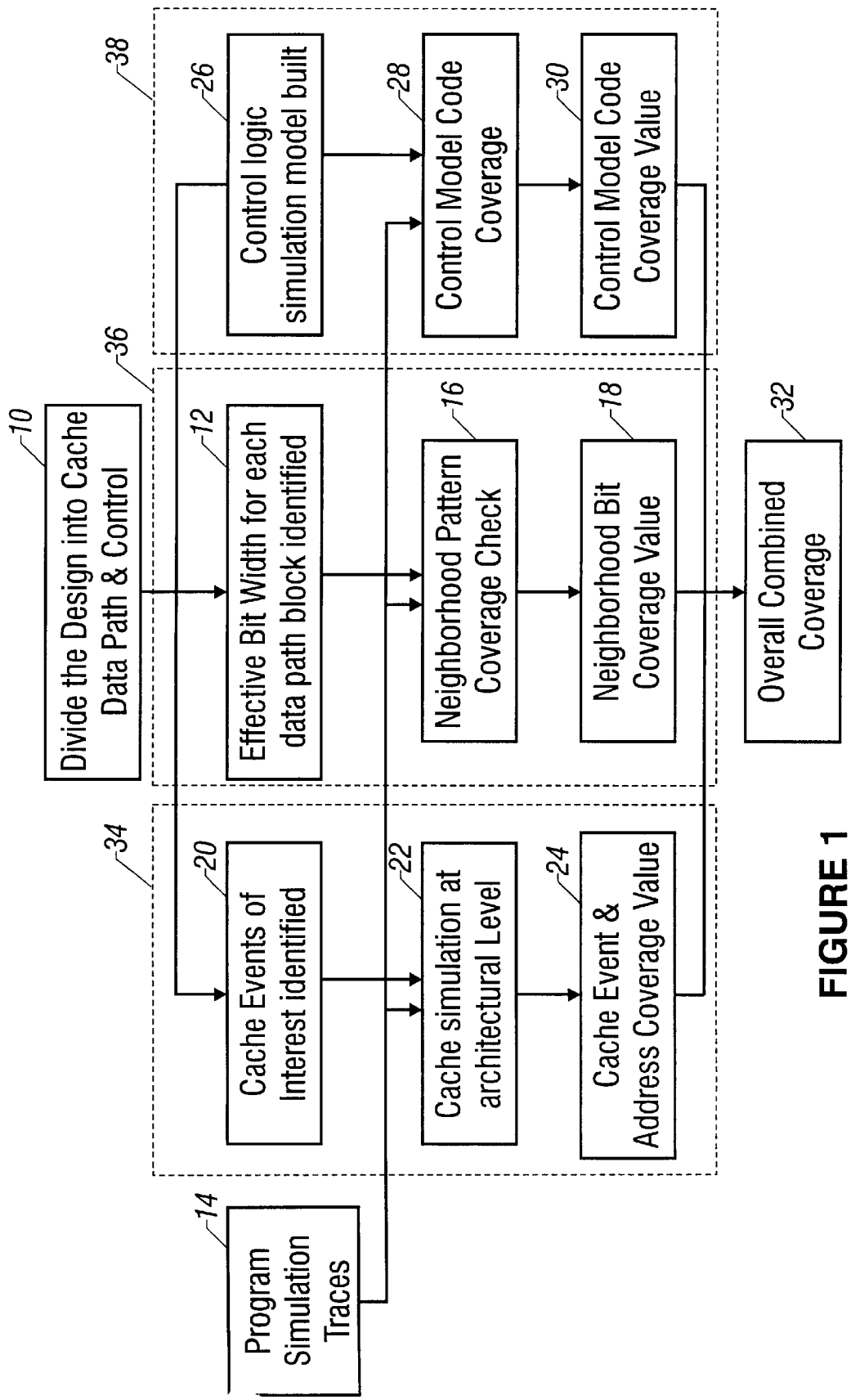
FIG. 1 is a flow diagram for the method described herein.

An architectural coverage measure useful for fault grading complex systems such as microprocessors may analyze selected elements of the system design in order to evaluate fault coverage of system test vectors. The system design may be represented, for fault grading purposes, by three core elements—the cache, data path and control logic, as indicated at Block 10 in FIG. 1. An overall coverage measure for a system may be developed by determining a coverage measure for each of the system's cache (flow 34), data path (flow 36) and control logic (flow 38). The system coverage measure may be derived from the component level coverage measures to provide a tractable coverage measure which facilitates analysis within a reasonable amount of time and thereby is cost effective.

The coverage measure may use system level test vectors (Block 14). The test vectors may be in the form of operating system or other application software which has been trimmed, through a process of evaluation, to determine the most effective coverage for a given system and device fabrication process. The test vectors may run on the order of a minute or more. For example, 15 minutes could be used in a higher performance system. The coverage measure may then provide an improved measure of how effective those vectors are in locating defects. The test vectors 14 are applied to each of the selected system components (cache, data path, and control logic).

One component of the coverage measure is obtained from the data path, as indicated by flow 36. The data path in modern microprocessors and other complex systems may be, for example, 32 or 64 bits wide. However, each output bit of each functional block is determined in most, if not all cases, by far fewer bits. For each functional block there is an effective bit width that controls the output of the block. Thus, initially a determination is made of how many inputs affect each output bit of the data path blocks. Then, the effective bit width for each functional block is evaluated (Block 12).

The effective bit width for each data block may be determined, for example, using machine language data patterns. An exemplary decoder output bit may have no more than five inputs that primarily control its output so its effective bit width may be five. Some adders may have eight inputs with an effective bit width of eight and a multiplier might have an effective bit width of four. The effective bit width defines the bit neighborhood of input bits of interest that effectively determines the output state of any given output bit.

Another way of determining the effective bit width is to apply bit-wise random patterns to a given functional block in a fault simulation. When the coverage gain levels off as the bit width of the applied patterns increases, this reveals the effective bit width.

For example, the pattern below indicates a 3 bit exhaustive pattern:

```
000
001
010
011
100
101
110
111
```

By concatenating those patterns three times, the following pattern results:

```
000000000
001001001
010010010
011011011
100100100
101101101
110110110
111111111
```

Any 3 bit window of this pattern will have exhaustive patterns. For example, bits 0, 1 and 2 have 8 exhaustive patterns. Bits 1, 2 and 3 (since bit 3 is exactly the same as bit 0) will again have 8 patterns. Similarly, any sliding window of 3 will have 8 exhaustive patterns. In this way, patterns may be generated that have exhaustive N-bit patterns for any arbitrary N's.

Figure 2:
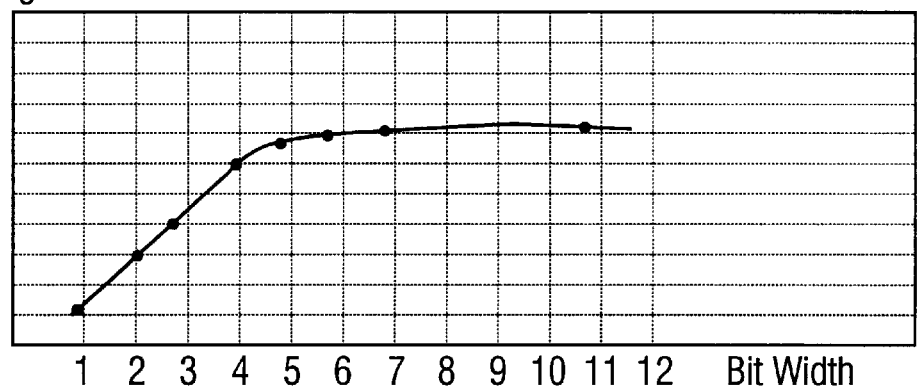
FIG. 2 is an exemplary graph of fault coverage versus bit width for a hypothetical example.

For a given data path block, N-bit exhaustive patterns may be applied in a fault simulation with N increasing to a reasonably large number. The point where the fault coverage levels off is the effective bit width of that block. In the example shown in FIG. 2, the effective bit width of the hypothetical functional block is 5.

Important patterns in the bits can be then deduced since the adjacent bits on the data bus are numbered, such as 0 to 31 for a 32 bit wide data path. Using bit nomenclature, adjacent bits can be identified as part of a neighborhood bit analysis.

Data values are set forth in the instruction set so it is a simple matter to determine the data values. By following the data paths one can determine, for any given bit width, how many different data bit patterns have been exercised for a given bit neighborhood, which could be five bits, 9 bits, 10 bits or whatever it may be. By checking how exhaustively different neighborhood bits have been exercised, the coverage of all of the data path blocks in the design may be evaluated.

The data path bits and their neighbors are laid out and examined for trends (FIG. 1, Block 16). A coverage measure is determined, using the simulation traces 14, to come up with the coverage for all the data path blocks for the test vectors (Block 18). If necessary, it is possible to validate the results with the fault coverage actually obtained on these blocks.

Usually a circuit is completely or substantially completely exercised if a window of bits of inputs going into the circuit is exhaustively tested. For example, a 16 bit input circuit may yield a window of 4 bits, meaning the output of most devices in the circuit depends only on the neighboring four bits of the input. If patterns could exhaustively go through all combinations of the 4 bits for the 16 bit input, most of the circuit may be deemed to have been exercised. Such a pattern set can be as small as only $2^4$ (or 16 vectors).

This same reasoning can aid in determining the usefulness of existing test vectors. In other words, a determination can be made about how a set of test vectors performs in exhaustively going through a 4 bit window of patterns. For example, assume an input of 5 bits (A0 . . . A4) total and the effective bit width has been determined to be 3 neighboring bits. An exhaustive window of 3 is 8 different patterns ($2^3$ bits). There are three neighboring sets of width three in this circuit: set 1: (A0, A1, A2), set 2: (A1, A2, A3), and set 3: (A2, A3, A4). One hypothetical set of test vectors is as follows:

|  | A0 | A1 | A2 | A3 | A4 |
| --- | --- | --- | --- | --- | --- |
| Vector 1 | 0 | 1 | 0 | 1 | 0 |
| Vector 2 | 1 | 0 | 0 | 1 | 0 |
| Vector 3 | 1 | 1 | 0 | 1 | 0 |

Using an exhaustive window of 3 neighboring bits, each set can be graded and finally the grades can be rolled up to come up with a final grading for these vectors. Set 1 has three different unique patterns (010, 100, 110) which would satisfy 3 out of 8 possible patterns for this set (3/8). Set 2 only has 2 unique patterns (101, 001) out of eight (2/8) and set 3 has only one unique pattern (010) out of eight (1/8). An exhaustive pattern would require 8 out of 8 possible patterns on all sets or a total of 8/8+8/8+8/8=3. This set of patterns has a coverage measure of 3/8+2/8+1/8=6/8=0.75. So the percentage coverage of window 3 for this vector set is: 0.75/3 * 100=25%.

If this same vector set is also going to other functional blocks "a" through "d" with effective bit widths of 1, 2, 4 and 5, the coverage measure numbers for each block determined, as explained above, decrease with increasing bit width and decreasing numbers of sets:

| | | |
|---|---|---|
| Block a (window width of 1): | | |
| Set 1. | (A0) | 2/2 |
| Set 2. | (A1) | 2/2 |
| Set 3. | (A2) | 1/2 |
| Set 4. | (A3) | 1/2 |
| Set 5. | (A4) | 1/2 |
| | | 7/10 |
| For five sets, the coverage percentage is 70%. | | |
| Block b (window width of 2): | | |
| Set 1. | (A0, A1) | 3/4 |
| Set 2. | (A1, A2) | 2/4 |
| Set 3. | (A2, A3) | 1/4 |
| Set 4. | (A3, A4) | 1/4 |
| | | 7/16 |
| For four sets, the coverage percentage is 43.75%. | | |
| Block c (window width of 4): | | |
| Set 1. | (A0, A1, A2, A3) | 3/16 |
| Set 2. | (A1, A2, A3, A4) | 2/16 |
| | | 5/32 |
| For two sets, the coverage percentage is 15.6%. | | |
| Block d (window width of 5): | | |
| Set 1. | (A0, A1, A2, A3, A4) | 3/32 |
| | | 3/32 |
| For one set, the coverage percentage is 9.3%. | | |

The data patterns can be analyzed by computer for given blocks from machine language instructions, and then in any given data path that is touched by these instructions, one can determine how exhaustively a neighborhood of a given number of bits was exercised (Block 16). A coverage measure may then be determined (Block 18) for a given effective bit width. Then all blocks having that bit width and affected by the same machine language instructions are assumed to have the same coverage.

The next component of the system coverage measure is developed by the control logic or finite state machine ("FSM") flow 38. A control logic model is built (Block 26) and coverage may be determined using a micro-architectural level simulation program (Block 28). The test coverage software called PureCoverage distributed by Rational Software Corp., Cupertino, Calif. may be used, for example. From these simulations, one may use the Hardware Description Language ("HDL") line coverage information which indicates which branches were taken to determine the code coverage (Block 30). The architectural level simulation program is run to extract the control logic activity during the test vectors. One determines which lines of that simulation program are covered and uses that information to come up with a coverage measure for the control logic.

Finally, a coverage measure for the cache is determined by flow 34. Various techniques may be utilized to develop the cache coverage measure. A commercial cache simulator may be used to check for coverage of various cache events during the test vectors, as indicated by flow 34. The cache simulator is used in design to determine cache size and to predict cache performance. Initially, cache events of interest are identified (Block 20). A cache simulation at the architectural level is undertaken (Block 22). The simulation shows which addresses have been accessed. A cache event and address coverage value is assigned (Block 24).

Alternatively, conventional event monitor, on board in some microprocessors such as the Intel Pentium® II microprocessor, may be utilized that keeps track of the occurrence of certain cache events and accumulates those events in a scoreboard register. The scoreboard register can be read to determine how many times a certain event occurred.

Using the cache coverage measure from the flow 34, together with the corresponding values determined from the data path flow 36 and the control logic coverage flow 38, an overall combined coverage is determined (Block 32). The overall combined coverage could be a straight averaging of the values from the cache, control logic and data path or it could be a weighted average. Designers familiar with a particular system in question can determine weighting to emphasize blocks that are more critical in the fault analysis.

Using these techniques at or slightly below the architectural level, a tractable approach may be developed that is amenable to high speed processing of extended length program test vectors. Such a result is not feasible using conventional stuck at fault models.

While the present invention has been described with respect to a limited number of preferred embodiments, those skilled in the art will appreciate a number of modifications and variations. It is intended that the appended claims cover all such modifications and variations as fall within the true spirit and scope of the present invention.

What is claimed is:

1. A method for determining a coverage measure for selecting defect screening tests for a system having a control, data path and cache, said method comprising:
   obtaining a coverage measure by determining the effective bit width for a plurality of data path blocks; and
   using said coverage measure as a measure of system level coverage.

2. The method of claim 1 wherein the step of obtaining a coverage measure includes obtaining a coverage measure for at least two of the cache, control logic and data path.

3. The method of claim 2 including using as a test vector a machine language version of commercial software.

4. The method of claim 3 wherein said vector has an execution time on the order of a minute or more.

5. The method of claim 1 wherein the step of obtaining a coverage measure includes obtaining a coverage measure for all three of the cache, control logic and data path.

6. The method of claim 5 wherein the step of obtaining a coverage measure includes the step of identifying cache events.

7. The method of claim 6 wherein the step of obtaining a coverage measure includes the step of accumulating cache events at the architectural level.

8. The method of claim 7 wherein the step of obtaining a coverage measure includes the step of using a cache simulation to accumulate the events.

9. The method of claim 5 wherein the step of obtaining a coverage measure includes performing a control logic code coverage analysis.

10. The method of claim 9 including using hardware description language line coverage capability to determine code coverage.

11. The method of claim 1 including determining the neighborhood pattern coverage for each data path block.

12. The method of claim 11 including determining a neighborhood bit coverage value.

13. The method of claim 1 wherein the step of obtaining a data path coverage measure includes the step of developing a neighborhood bit pattern.

14. A method of determining a coverage measure for a data path having a number of data path blocks comprising the steps of:

determining the effective bit width of a number of data path blocks;

identifying selected bit patterns of the effective bit width;

tracking the occurrence of said bit patterns; and determining the coverage for said data path blocks.

15. The method of claim 14 including also obtaining a cache and a control logic coverage measure.

16. The method of claim 15 including determining an architectural coverage measure for a system having a data path, cache and control logic using coverage measures obtained for the cache, data path and control logic.

17. The method of claim 14 including obtaining a coverage measure by assuming that blocks with the same bit width have the same coverage for the same vectors.

18. The method of claim 17 including analyzing how exhaustively adjacent bits are exercised.

19. A method for determining an architectural level coverage measure for a system having a data path, cache and control logic, said method comprising the steps of:

obtaining a coverage measure for the data path by determining the effective bit width of a number of data path blocks, determining a plurality of bit test patterns, tracking the occurrence of those patterns and determining a coverage measure for each of the blocks;

obtaining a coverage measure of the cache and control logic; and determining an overall coverage measure for the system using the data path, control logic and cache coverage measures.

20. The method of claim 19 wherein the step of obtaining a coverage measure of the cache includes the step of identifying cache events.

21. The method of claim 20 including accumulating cache events at the architectural level.

22. The method of claim 21 including using a cache simulation to accumulate the events.

23. The method of claim 19 wherein the step of obtaining a coverage measure for the control logic includes the step of performing a control logic code coverage analysis.

24. The method of claim 19 wherein the step of obtaining a coverage measure for the cache includes using as a test vector a machine language version of commercial software.

25. The method of claim 24 wherein said vector has an execution time on the order of one minute or more.

* * * * *